US008859982B2

(12) United States Patent
Jiang et al.

(10) Patent No.: US 8,859,982 B2
(45) Date of Patent: Oct. 14, 2014

(54) DUAL-LENS-GUN ELECTRON BEAM APPARATUS AND METHODS FOR HIGH-RESOLUTION IMAGING WITH BOTH HIGH AND LOW BEAM CURRENTS

(75) Inventors: Xinrong Jiang, Palo Alto, CA (US); Liqun Han, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/618,760

(22) Filed: Sep. 14, 2012

(65) Prior Publication Data
US 2014/0077077 A1    Mar. 20, 2014

(51) Int. Cl.
*H01J 37/14*    (2006.01)

(52) U.S. Cl.
USPC ............................... 250/396 ML; 250/423 F (58) Field of Classification Search
USPC .................. 250/396 R, 396 ML, 423 F, 310
See application file for complete search history.

(56) References Cited

U.S. PATENT DOCUMENTS

| | | | |
|---|---|---|---|
| 3,979,890 A | 9/1976 | Schenk | |
| 5,444,243 A | 8/1995 | Kohhashi et al. | |
| 5,616,920 A | 4/1997 | Plies | |
| 6,111,253 A | 8/2000 | Tsuno | |
| 6,407,384 B1 | 6/2002 | Tanaka et al. | |
| 6,717,141 B1 | 4/2004 | Rouse et al. | |
| 6,753,533 B2 * | 6/2004 | Mita | 250/396 R |
| 6,949,745 B2 | 9/2005 | Yonezawa | |
| 7,560,691 B1 | 7/2009 | Gubbens | |
| 7,755,043 B1 | 7/2010 | Gubbens | |
| 7,821,187 B1 * | 10/2010 | Jiang et al. | 313/361.1 |
| 7,863,580 B2 | 1/2011 | Hatakeyama et al. | |
| 8,035,082 B2 | 10/2011 | Yamazaki et al. | |
| 8,067,732 B2 | 11/2011 | Nakasuji et al. | |
| 2010/0187433 A1 * | 7/2010 | Eastham | 250/396 R |
| 2011/0018470 A1 | 1/2011 | Zhang et al. | |
| 2011/0309263 A1 | 12/2011 | Hill et al. | |
| 2012/0091360 A1 | 4/2012 | Zhang et al. | |
| 2012/0217152 A1 | 8/2012 | Miller | |

FOREIGN PATENT DOCUMENTS

JP    2009-187950    8/2009

OTHER PUBLICATIONS

International Search Report and Written Opinion of the International Searching Authority for Application No. PCT/US2013/059788, Dec. 27, 2013, 7 sheets.

* cited by examiner

*Primary Examiner* — Kiet T Nguyen
(74) *Attorney, Agent, or Firm* — Okamoto & Benedicto LLP (57) ABSTRACT

One embodiment relates to an electron beam apparatus which includes a dual-lens electron gun for emitting an electron beam. The electron beam is a high beam-current electron beam in a first operating mode and a low beam-current electron beam in a second operating mode. The apparatus further includes a column aperture which is out of the path of the high beam-current electron beam in the first operating mode and is centered about an optical axis of the electron beam apparatus in the second operating mode. Another embodiment relates to an electron gun which includes a first gun lens, a beam limiting aperture, and a second gun lens. The first gun lens focuses the electrons before they pass through the beam-limiting aperture while the second gun lens focuses the electrons after they pass through the beam-limiting aperture. Other embodiments, aspects and features are also disclosed.

7 Claims, 8 Drawing Sheets

DUAL-LENS-GUN ELECTRON BEAM APPARATUS AND METHODS FOR HIGH-RESOLUTION IMAGING WITH BOTH HIGH AND LOW BEAM CURRENTS

BACKGROUND OF THE INVENTION

1. Field of the Invention

The present invention relates to apparatus and methods for electron beam imaging.

2. Description of the Background Art

A conventional electron beam apparatus commonly includes, among other modules, an emission module, a beam current selection module, and a resolution optimization module. The conventional emission module typically uses either a thermal field emission (TFE) emitter with a relatively larger source energy spread or a cold field emission (CFE) emitter with a relatively smaller source energy spread. The conventional beam current selection module typically includes a single focusing lens configured together with fixed beam-limiting and column apertures. The resolution optimization module typically includes condenser and objective electron lenses. The focus of the condenser lens and the focus of the objective lens are commonly varied to find an optimal convergent angle at which the electron beam spot size at the target wafer is minimized.

SUMMARY

One embodiment relates to an electron beam apparatus which includes a dual-lens electron gun for emitting an electron beam. The electron beam is a high beam-current electron beam in a first operating mode and a low beam-current electron beam in a second operating mode. The apparatus further includes a column aperture which is out of the path of the high beam-current electron beam in the first operating mode and is centered about an optical axis of the electron beam apparatus in the second operating mode.

Another embodiment relates to an electron gun which includes a first gun lens, a beam limiting aperture, and a second gun lens. The first gun lens focuses the electrons before they pass through the beam-limiting aperture while the second gun lens focuses the electrons after they pass through the beam-limiting aperture.

Another embodiment relates to a method for generating two electron beams having different beam currents using a single electron gun for an electron beam column. The electron gun is operated in a first operating mode by turning on a first lens of the electron gun and turning off a second lens of the electron gun. The electron gun is operated in a second operating mode by turning off the first lens of the electron gun and turning on the second lens of the electron gun.

Other embodiments, aspects and features are also disclosed.

DETAILED DESCRIPTION

Due to electron-electron interactions, conventional electron beam apparatus have substantial difficulties in meeting resolution requirements for both high and low beam current imaging in a shared electron beam column. Hence, for example, electron beam inspection and review are conventionally performed using separate electron beam columns. For instance, wafer inspection with voltage contrast sensitivity may be performed using a column designed for operation at a high beam current (e.g., 20 to 500 nanoamperes), while defect review may be performed using a column designed to operate at a low beam current (e.g., less than one nanoampere). Wafer inspection with physical sensitivity also may be performed using a separate column designed to operate at a low beam current (e.g., 1 to 20 nanoamperes).

The present disclosure provides an innovative gun lens design which substantially improves electron beam imaging resolutions for both low and high beam current applications in a single column. Hence, the present disclosure makes it feasible to combine electron beam inspection and review tools (or other high and low beam current applications) into a single column apparatus, thereby not only saving both cost and space, but also avoiding the between-column crosstalk that may be a nightmare in degrading optical performance.

Figure 1:
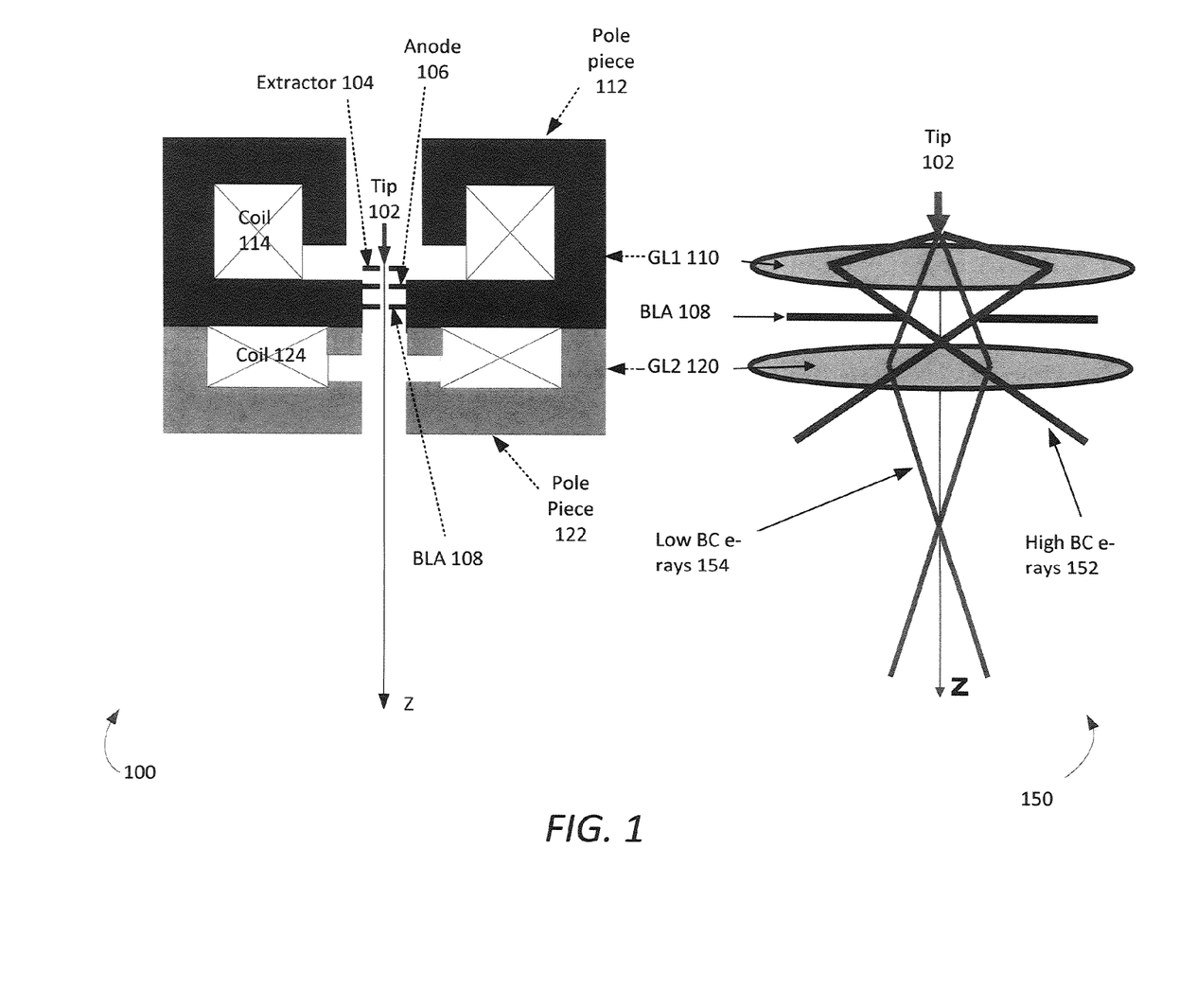
FIG. 1 provides a schematic diagram and a corresponding electron ray diagram of a dual-lens electron gun in an accordance with an embodiment of the invention.

FIG. 1 provides a schematic diagram and a corresponding electron ray diagram of a dual-lens electron gun 100 in an accordance with an embodiment of the invention. As shown in the cross-sectional diagram on the left side of FIG. 1, a field-emission-based emitter for the electron gun 100 is formed by the emitter tip 102, extractor 104 and anode 106. The emitter may be either thermal-field-emission (TFE) based or a cold-field-emission (CFE) based. In accordance with an embodiment of the invention, the electron gun 100 further includes an upper magnetic lens (GL1) 110, a lower magnetic lens (GL2) 120, and a beam-limiting aperture (BLA) 108.

As shown, the upper magnetic lens 110 may include an upper pole piece 112 and an upper coil 114. As further shown, the lower magnetic lens 120 may include a lower pole piece 122 and a lower coil 124. In one embodiment, the beam-limiting aperture 108 may be with a fixed size and sandwiched between the pole pieces (112 and 122) for the upper and lower magnetic lenses.

In accordance with an embodiment of the invention, the dual-lens electron gun 100 may be operated in two distinct modes: a high beam-current mode; and a low beam-current mode. These two operating modes are illustrated in the electron ray diagram 150 on the right side of FIG. 1. Depicted in the electron ray diagram 150 are the electron rays (e-rays) 152 in the high beam-current mode and the e-rays 154 in the low beam-current mode.

The high beam-current e-rays 152 may be formed by switching on the upper gun lens (GL1) 110 and switching off the lower gun lens (GL2) 120. In this high beam-current mode, the e-rays 152 from the emitter are focused by GL1 110 before passing through the BLA 108 and are not focused by GL2 120.

The low beam-current e-rays 154 may be formed by switching on the lower gun lens (GL2) 120 and switching off the upper gun lens (GL1) 110. In this low beam-current mode, the e-rays 154 from the emitter are not focused by GL1 110. Instead, the e-rays 154 pass through the BLA 108 first and are then focused by GL2 120.

Given the above, it may be considered that the dual-lens electron gun 100 provides either of two lenses. A first lens GL1 110 above the BLA 108 goes into effect in the high beam-current mode, and a second lens GL2 120 below the BLA 108 goes into effect in the low beam-current mode.

In a preferred implementation, the pole piece and coils in GL1 may be configured to minimize aberrations to avoid the pole piece being saturated and the coils overheating. The pole piece and coil in GL2 may be relatively straightforward in design because the excitation required is low, and the gun lens aberrations should not substantially impact the resolution for low beam-current applications.

Figure 2:
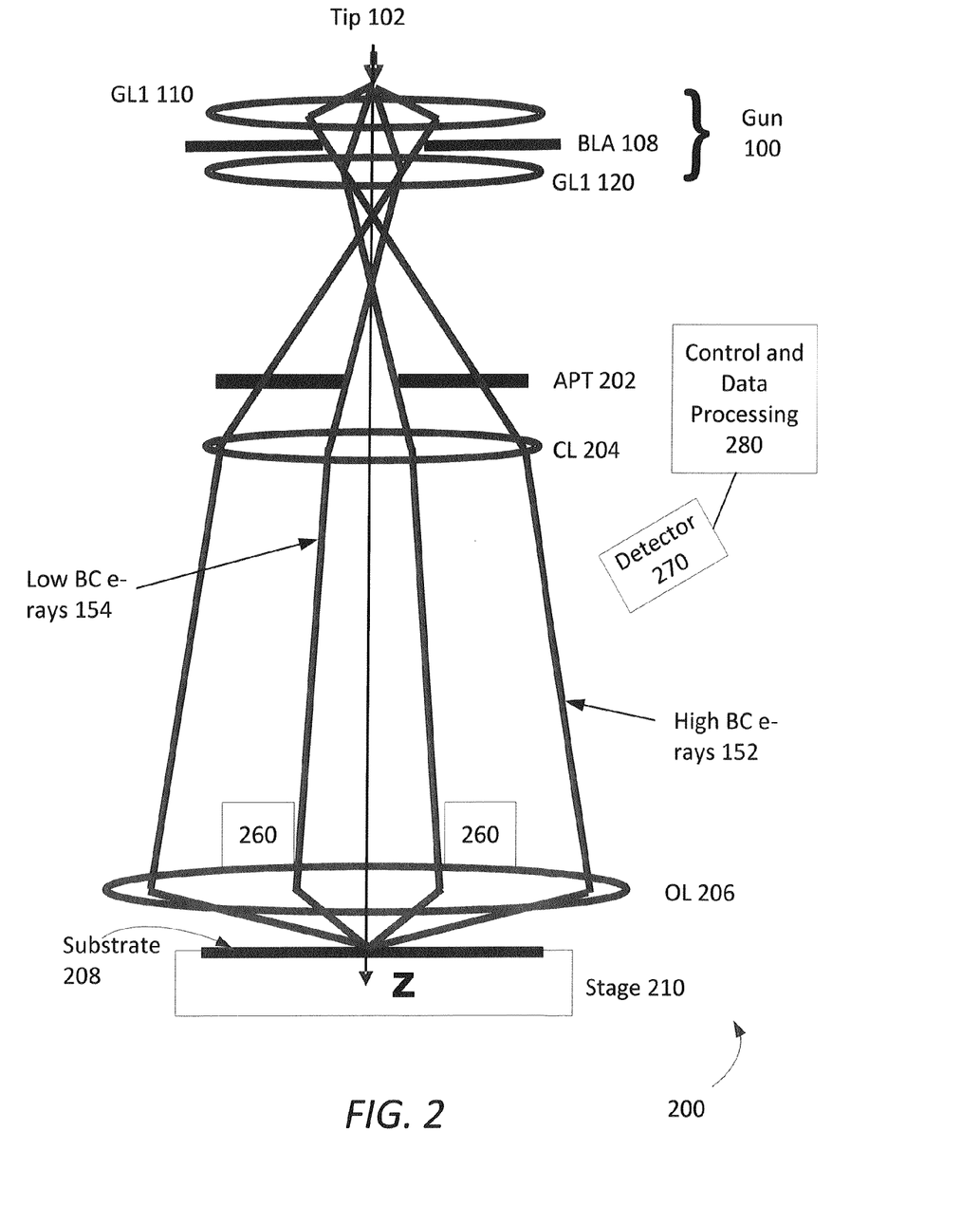
FIG. 2 is an electron ray diagram of an electron beam imaging apparatus including the dual-lens gun in an accordance with an embodiment of the invention.

FIG. 2 is an electron ray diagram of an electron beam imaging apparatus including the dual-lens gun 100 in an accordance with an embodiment of the invention. As shown, the apparatus 200 may include, below the gun 100, a column aperture (APT) 202, a condenser lens (CL) 204, an objective lens (OL) 206, and a target substrate 208 held on a movable stage 210. The apparatus 200 may further include a scan deflector 260, a detector 270 and a control and data processing system 280.

As further shown, an electron beam is formed along the optical axis z within the vacuum chamber of the e-beam column. The e-beam formed may be the high beam-current e-beam 152 in the high beam-current mode or the low beam-currrent 154 in the low beam-current mode.

In the high beam-current mode, the column aperture (APT) 202 is taken out of the path of the high beam-current e-rays 152. For example, the APT 202 may be changed to a much larger aperture size such that the e-rays 152 are not blocked. In other words, APT 202 in FIG. 2 is moved away so that the e-rays 152 passing through the BLA 108 are not blocked by the APT 202. The e-rays 152 are focused by the CL 204 and the OL 206 onto the surface of the target substrate 208. Secondary electrons may be detected by detector 270, and image data may be obtained by scanning the beam over an area of the target surface using the scan deflector 260.

Figure 3:
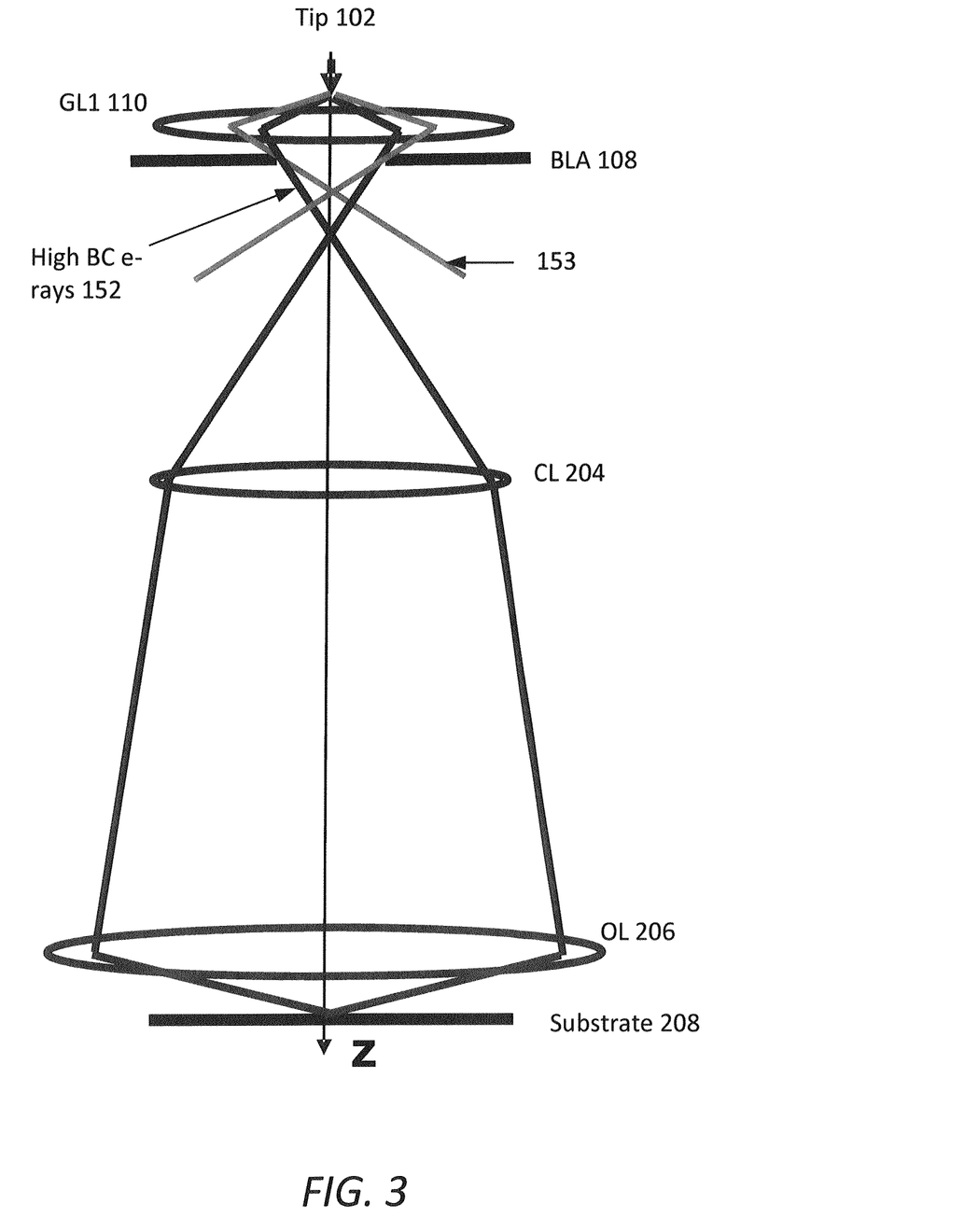
FIG. 3 is an electron ray diagram of the electron beam imaging apparatus in a high-beam-current imaging mode in an accordance with an embodiment of the invention.

The column in the high beam-current mode (without the APT 202) is depicted in FIG. 3. As shown, the high beam-current (high BC) e-rays 152 formed using GL1 110 are focused by CL 204 and OL 206 onto the target substrate 208. As further shown, the beam current may be adjusted in this mode by adjusting the magnetic field strength of GL1 110. For example, the e-rays 153 may be formed by increasing the magnetic field strength of GL1 110.

Advantageously, in the high beam-current mode, residual electrons below BLA 108 are substantially reduced or eliminated, thereby removing the effects of Coulomb interactions due to the residual electrons in a conventional apparatus. This GL1-operation mode is particularly useful for inspection applications with voltage contrast sensitivity and also somewhat with physical sensitivity.

In the low beam-current mode, the column aperture (APT) 202 is positioned as depicted in FIG. 2. The low beam-current e-rays 154 that pass through the APT 202 are focused by the CL 204 and the OL 206 onto the surface of the target substrate 208. Secondary electrons may then be detected by detector 270, and image data may be obtained by scanning the beam over an area of the target surface.

Figure 4:
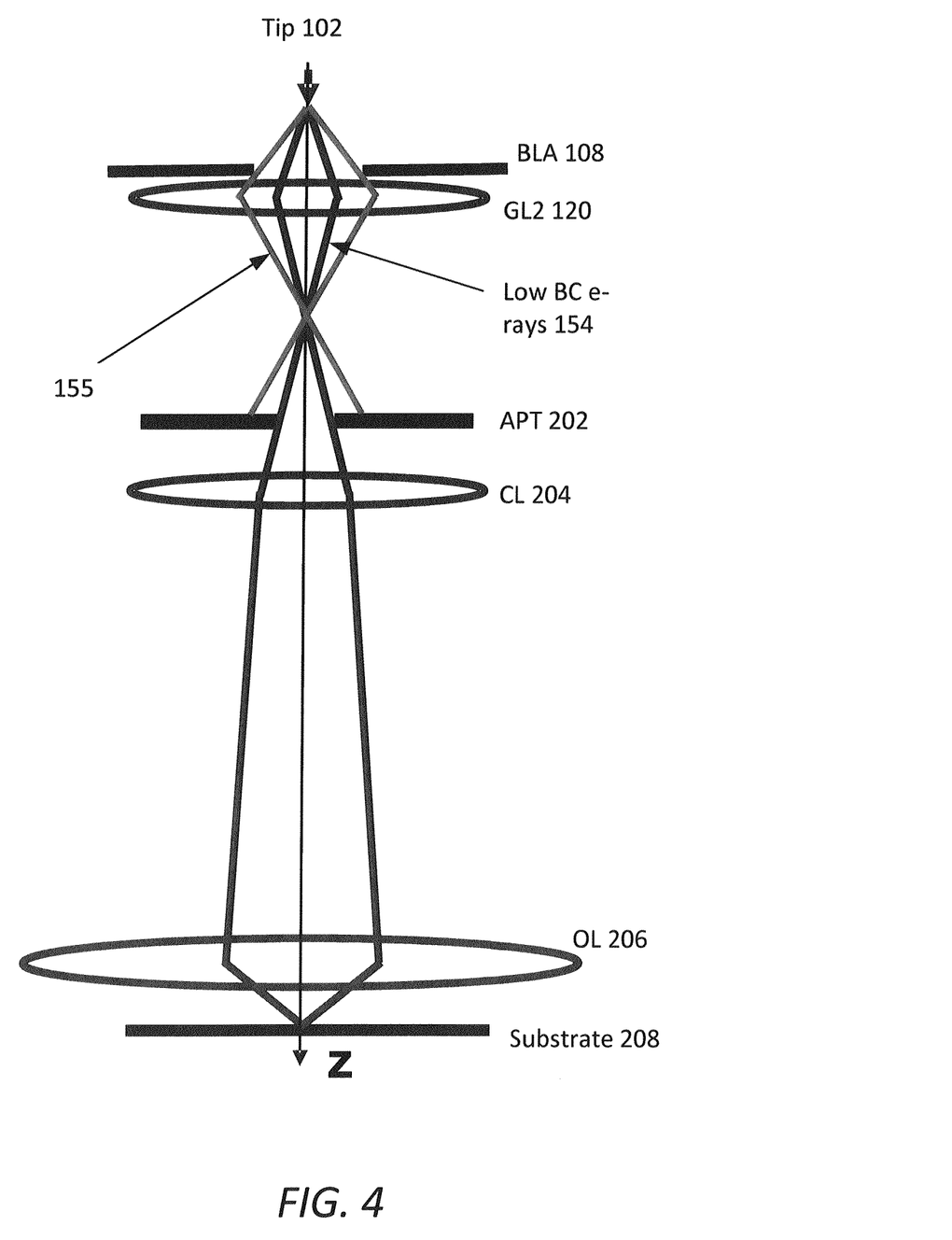
FIG. 4 is an electron ray diagram of the electron beam imaging apparatus in a low-beam-current imaging mode in an accordance with an embodiment of the invention.

The column in the low beam-current mode (with the APT 202) is depicted in FIG. 4. As shown, the low beam-current e-rays 154 formed using GL2 120 pass through APT 202 and are focused by CL 204 and OL 206 onto the target substrate 208. The low beam-current is only a portion of the total raw current below the BLA 108 (the e-rays 155). As further shown, the low beam current may be adjusted in this mode by adjusting the magnetic field strength of GL2 120 although the total raw current is fixed. For example, increasing the strength of GL2 120 decreases the number of the electrons passing through the column APT 202 and reduces the final beam current to the substrate 208.

Advantageously, in the low beam-current mode, the beam current in between the BLA 108 and the APT 202 may be at a very low level on the order of nanoamperes. At this very low level of beam current, the influence of Coulomb interactions between the residual electrons on the imaging resolution is substantially reduced such that it may be neglected. This GL2-operation mode is particularly useful either for inspection applications with physical sensitivity or for defect-review applications with beam currents of sub-nanoamperes.

In a preferred embodiment, a single electron-beam column uses the dual-lens gun 100 to achieve high resolution in both high beam-current and low beam-current applications. As such, the single electron-beam column may replace two conventional columns: a first column configured for high-resolution imaging at a high beam-current; and a second column designed for high-resolution imaging at a low beam-current.

Figure 5:
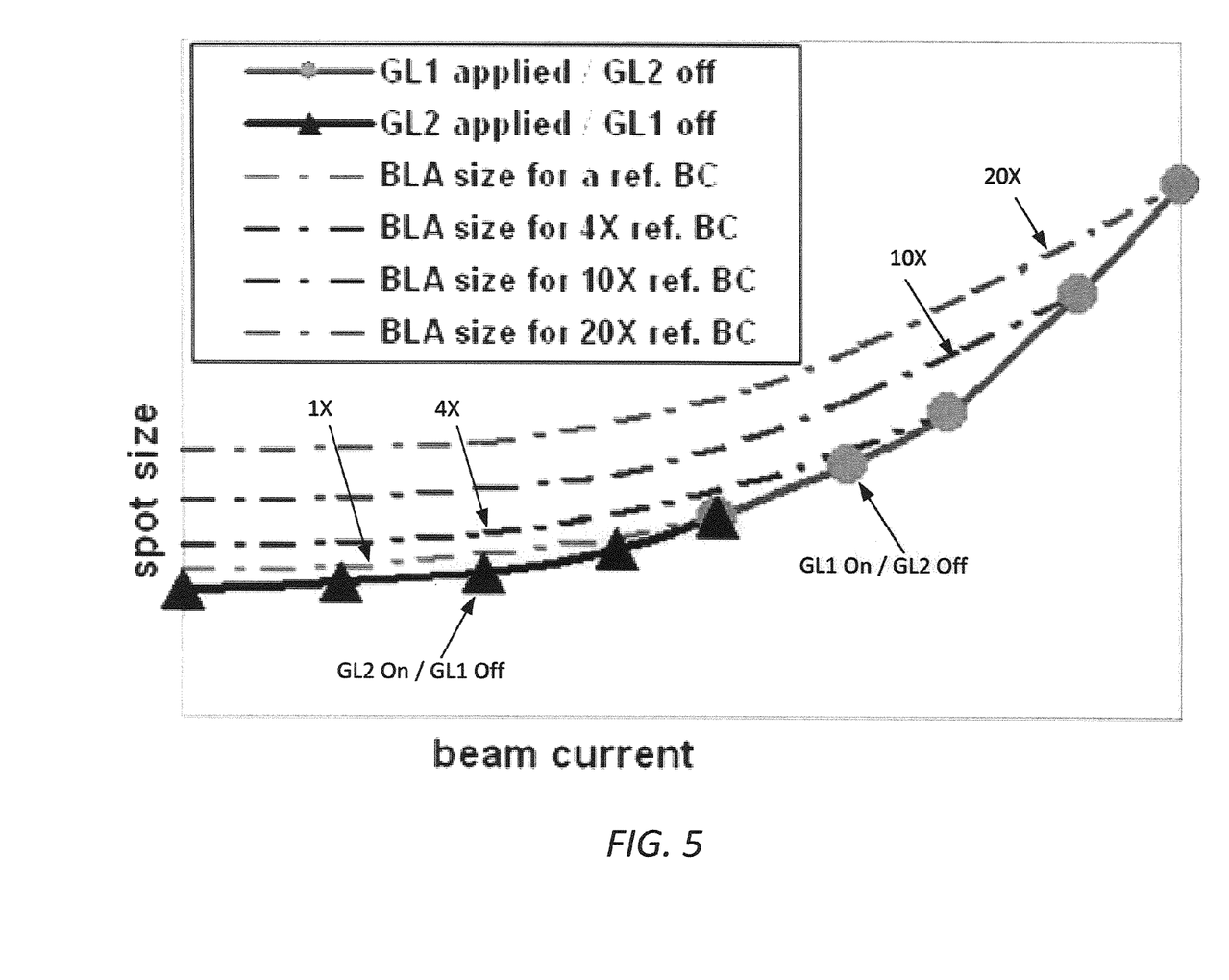
FIG. 5 is a graph of spot size versus beam current which shows the improved resolution at a same beam current that is achieved in an accordance with an embodiment of the invention.

FIG. 5 is a graph of spot size versus beam current which shows the improved resolution at a same beam current that is achieved in an accordance with an embodiment of the invention. The data in FIG. 5 is generated by computer simulation of the electron-beam columns.

The graph shows the spot size vs. beam current of both the low beam-current mode with GL2 applied and GL1 off (triangle shapes) and the high beam-current mode with GL1 applied and GL2 off (circle shapes). In comparison, the graph shows the spot size vs. beam current of a conventional electron beam column with a variable BLA size. In particular, the spot size vs. beam current is shown for four different BLA sizes. A first BLA size is for one-times (1×) a reference beam-current level. A second BLA size is for four-times (4×) a reference beam-current level. A third BLA size is for ten-times (10×) a reference beam-current level. A fourth BLA size is for twenty-times (20×) a reference beam-current level.

As seen, the high and low beam-current modes using the dual-lens gun of the present disclosure provide the smallest spot size for a given level of beam current. Smaller spot size corresponds to higher resolution. Hence, the dual-lens gun is shown to provide improved resolution compared to the conventional electron beam column. The improvement in resolution shown in FIG. 5 is most pronounced for low beam-currents.

Figure 6:
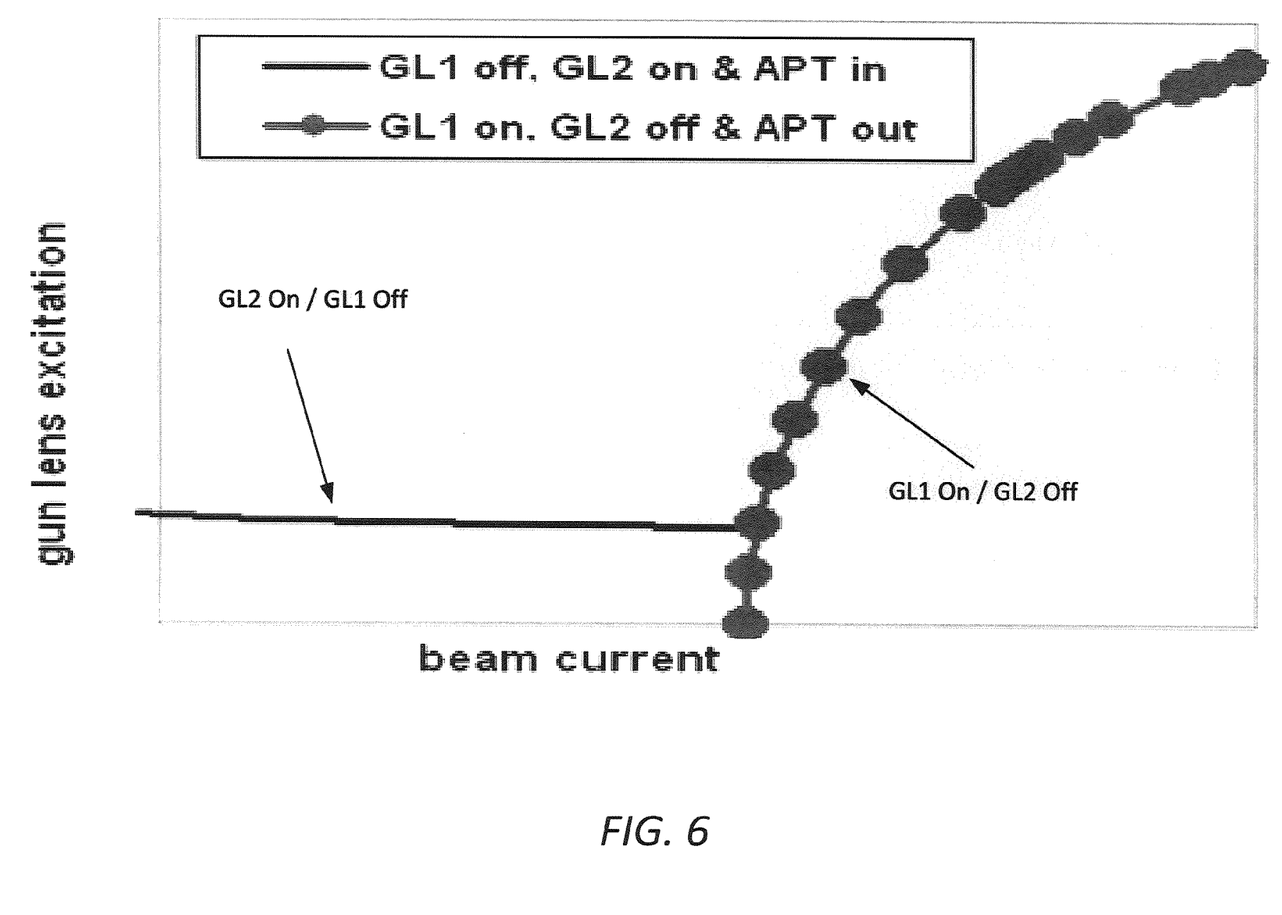
FIG. 6 is a graph of gun lens excitation versus beam current in an accordance with an embodiment of the invention.

FIG. 6 is a graph of gun lens excitation versus beam current in an accordance with an embodiment of the invention. The data in FIG. 6 is generated by computer simulation of an electron-beam column with the dual-lens gun disclosed herein.

As shown in FIG. 6, to select low beam-currents in the low beam-current mode (GL1 off, GL2 on, APT in), the excitation of GL2 is varied smoothly over a relatively small range. In contrast, to select high beam-currents in the high beam-current mode (GL1 on, GL2 off, APT off), the excitation of GL1 is varied strongly in a non-linear manner over a relatively large range.

Figure 7:
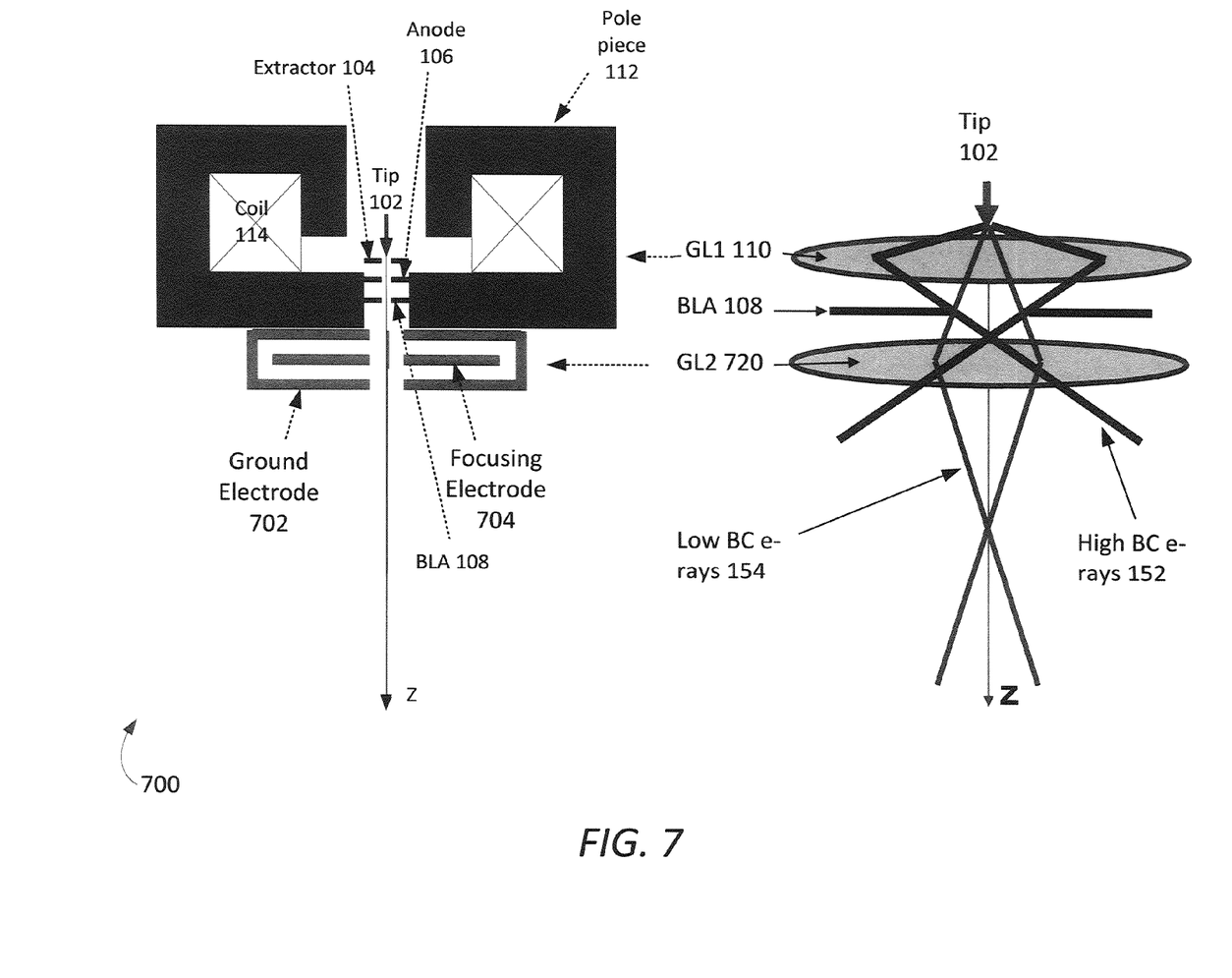
FIG. 7 provides a schematic diagram and a corresponding electron ray diagram of a dual-lens electron gun in an accordance with an alternate embodiment of the invention.

FIG. 7 provides a schematic diagram and a corresponding electron ray diagram of a dual-lens electron gun 700 in an accordance with an alternate embodiment of the invention. As shown, in this embodiment, the lower gun lens (GL2) 720 is implemented as an electrostatic lens. In the particular embodiment illustrated, the electrostatic lens is implemented using a focusing electrode 704 and a ground electrode 702 configured as an Einzol lens. In this embodiment, the voltage on the focusing electrode 704 is varied to change the excitation of GL2 720.

Other alternative electrostatic lenses may be used, instead of an Einzol lens. For example, GL2 may be implemented using an accelerating electrostatic lens or a decelerating electrostatic lens.

In other alternate embodiments, GL1 may also be implemented as an electrostatic lens which may be configured together with the emission system with the extractor and anode.

Figure 8:
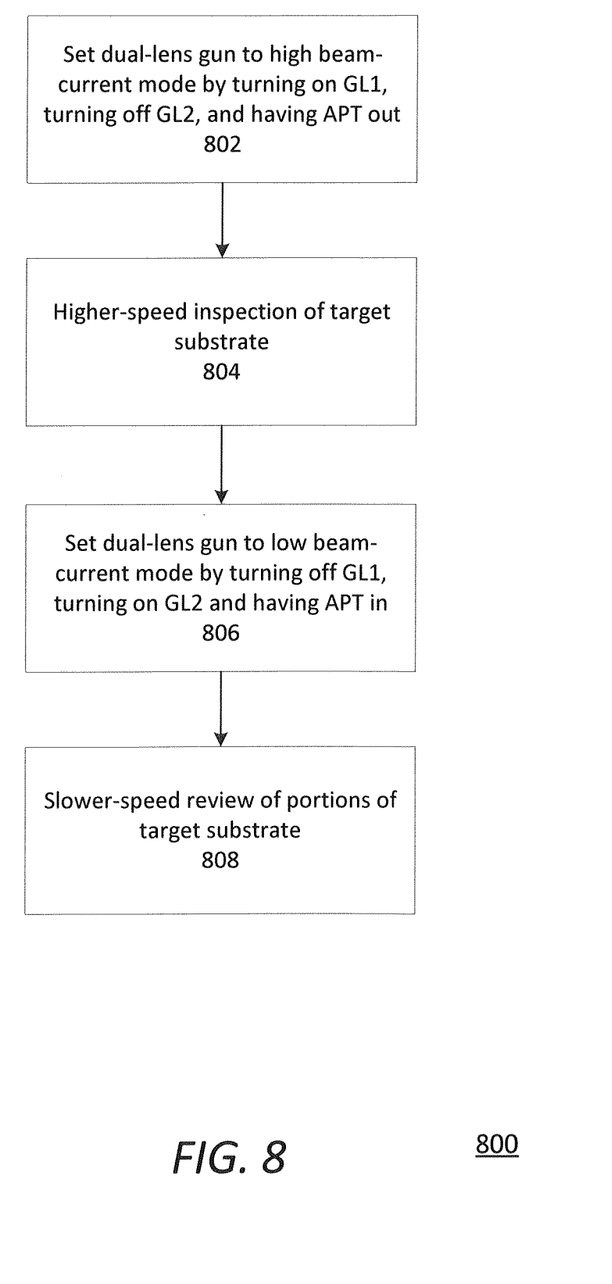
FIG. 8 is a flow chart of an example method of using an electron beam column with a dual-lens electron gun in an accordance with an embodiment of the invention.

FIG. 8 is a flow chart of an example method 800 of using an electron beam column with a dual-lens electron gun (100 or 700) in an accordance with an embodiment of the invention. In this example, both high-speed inspection and high-resolution review are performed using the same electron-beam column.

Per block 802, the e-beam column may be first configured such that the dual-lens gun is in a high beam-current mode. This may be accomplished by turning on GL1, turning off GL2 and having APT out. Per block 804, e-beam column is then used for higher-speed inspection of the target substrate.

Per block 806, the e-beam column may then be configured such that the dual-lens gun is in a low beam-current mode. This may be accomplished by turning off GL1, turning on GL2 and having APT in. Per block 808, the e-beam column is then used for slower-speed review of smaller portions of the target substrate.

Advantageously, the dual-lens gun disclosed herein provides a cost-efficient way to substantially improve performance of an electron-beam imaging column. This is accomplished without the need to modify the electron-emission system by using novel electron emitters or make other changes. The performance improvement also does not require other conventional approaches such as raising the beam energy, shrinking the column length, or re-designing the objective lens.

Furthermore, using the dual-lens gun disclosed herein, the resolution in low beam-current applications (such as SEM review, for example) may be kept optimized while sharing the column with high beam-current applications (such as SEM inspections, for example). This result is not achievable by following conventional approaches to improve performance. Moreover, with the dual-lens gun, the resolution for high beam-current applications is also improved substantially because of the removal of residual electrons. This is accomplished without the difficulty of implementing a variable BLA.

An electron beam apparatus using the above-disclosed dual-lens gun may be used in various applications. These applications include, but are not limited to, e-beam inspection, review and metrology on wafers, masks, templates, or light-emitting diodes.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron gun for generating an electron beam; the electron gun comprising:
    an electron emission system for emitting electrons;
    a first magnetic gun lens for focusing the electrons from the electron emission system to form an electron beam;
    a beam limiting aperture through which passes the electron beam focused by the first magnetic gun lens;
    a second magnetic gun lens for focusing the electron beam after the electron beam passes through the beam limiting aperture; and
    a controller for operating the electron gun in a first mode in which the first magnetic gun lens is on and the second magnetic gun lens is off and in a second mode in which the first magnetic gun lens is off and the second gun lens is on, wherein the first mode comprises a high beam-current mode, and the second mode comprises a low beam-current mode.

2. The electron gun of claim 1, wherein the electron emission system comprises a emitter tip, an extractor electrode, and an anode.

3. The electron gun of claim 1, wherein the first magnetic gun lens comprises a first pole piece and at least one coil.

4. The electron gun of claim 1, wherein the second magnetic gun lens comprises a second pole piece and at least one coil.

5. The electron gun of claim 1, wherein a beam current of the high beam-current electron beam is changed in the first operating mode by varying excitation of the first magnetic gun lens non-linearly over a first range.

6. The electron gun of claim 5, wherein the beam current of the low beam-current electron beam is changed in the second operating mode by varying excitation of the second magnetic gun lens linearly over a second range, wherein the second range is smaller than the first range.

7. The electron gun of claim 1, wherein a first beam cross-over is formed below the beam limiting aperture in the first operating mode, and wherein a second beam cross-over is formed below the second magnetic gun lens in the second operating mode.

* * * * *